United States Patent
Reis et al.

(10) Patent No.: US 6,235,986 B1
(45) Date of Patent: May 22, 2001

(54) ELECTROMAGNETIC INTERFERENCE GASKET

(75) Inventors: Bradley E. Reis, Wilmington; William F. Candy, Middletown; Ashwath P. Nityanandan, Newark; Mark R. Miller, Wilmington, all of DE (US)

(73) Assignee: Gore Enterprise Holdings, Inc., Newark, DE (US)

( * ) Notice: Subject to any disclaimer, the term of this patent is extended or adjusted under 35 U.S.C. 154(b) by 0 days.

(21) Appl. No.: 09/454,476

(22) Filed: Dec. 3, 1999

Related U.S. Application Data

(63) Continuation-in-part of application No. 09/052,080, filed on Mar. 31, 1998.

(51) Int. Cl.[7] ............................................. H05K 9/00
(52) U.S. Cl. ................................. 174/35 GC; 361/818; 174/35 R
(58) Field of Search ................................. 361/816, 818; 174/35 GC, 35 R; 439/607, 609

(56) References Cited

U.S. PATENT DOCUMENTS

| | | | |
|---|---|---|---|
| 5,641,438 | * | 6/1997 | Bunyan et al. .................. 264/40.3 |
| 5,825,634 | * | 10/1998 | Moorehead, Jr. ................. 361/816 |
| 5,959,244 | * | 9/1999 | Mayer .......................... 174/35 GC |

* cited by examiner

Primary Examiner—Shawn Riley
(74) Attorney, Agent, or Firm—Allan M. Wheatcraft

(57) ABSTRACT

An electromagnetic interference gasket formed of an electrically conductive material having a non-rectangular profile, whereby the profile may be viewed and processed by automated vision equipment during high-speed assembly of the gasket onto a conductive surface.

11 Claims, 2 Drawing Sheets

ELECTROMAGNETIC INTERFERENCE GASKET

RELATED APPLICATIONS

This application is a continuation-in-part of U.S. application Ser. No. 09/052,080, filed Mar. 31, 1998.

FIELD OF THE INVENTION

The present invention relates to an improved electromagnetic interference (EMI) gasket part. More particularly, the invention relates to an EMI gasket part, which is compatible with surface mount technology (SMT) installation.

BACKGROUND

An EMI gasket is a conductive interface material, which is used to connect an electrically conductive shield with a corresponding section of an electrical ground, such as a ground trace of a printed circuit board (PCB). Preferably, an EMI gasket should be highly electrically conductive and conformal. The gasket material fills the gaps between the shield and ground trace, thereby shielding the enclosed electronic equipment from electromagnetic interference.

In the area of EMI gaskets, it is desirable for designers to have an EMI gasket that is narrow. This allows the designer to make the corresponding PCB ("Printed Circuit Board") ground trace narrower, and thereby pack more SMT electrical components into a given space. A typical desired width for such a narrow EMI gasket, would be approximately 0.75 mm.

Further, an EMI gasket must also have conformability to be fully functional. In other words, the EMI gasket must be compressible so that it may absorb the loose flatness tolerances that are present between a PCB and shielding cover, and shield effectively. Typically, a PCB and shielding cover will require approximately 0.2–0.3 mm of conformability out of the gasket material, to accomplish this. Since most EMI gaskets compress 25–50%, a typical desired gasket thickness (prior to compression) is roughly 0.75 mm.

Therefore, since it is desirable to have an EMI gasket's width as 0.75 mm and its thickness of 0.75, the EMI gasket would have a so-called 1:1 (one-to-one) aspect ratio.

However, when EMI gaskets are made with a 1:1 aspect ratio such as this, several problems may occur, especially in the installation process.

Presently, EMI gaskets are almost exclusively installed directly onto a conductive shield, as opposed to the PCB. The present manufacturing techniques for installing EMI gasket parts include the following: dispensing a conductive paste or a conductive liquid material directly onto a conductive shield's surface and curing the dispensed material in-situ; die-cutting a conductive sheet material having an adhesive backer and then transferring, positioning and adhering the dimensioned material directly to a conductive shield's surface; or mechanically fastening a conductive spring-like metal material to a conductive shield's surface. Typically, when these EMI gasket materials are close to 1:1 aspect ratio, they are difficult to manufacture and install.

As is well understood by those skilled in the art, SMT (Surface Mount Technology) machines typically utilize a vacuum head on the end of a high-speed pick-and-place system to install tape-and-reel-fed PCB components onto surface-mount pads on a PCB. These pads are usually pre-screened with solder-paste (or conductive adhesive) and then sent through a reflow process (such as infrared—IR, vapor-phase, or convection) to melt the solder joints (or cure the adhesive), thereby forming an electrical and mechanical connection. As stated before, EMI gaskets are generally installed directly onto the shielding cover, which mates to a matching ground trace on the PCB. However, there is an SMT-compatible EMI gasket that can be placed directly onto the PCB, and soldered (or bonded) to the ground trace. This gasket can also be soldered or bonded to the shielding cover, as well, for additional flexibility. This type of gasket goes under the trade name of GORE-SHIELD® SMT EMI gaskets, as described in co-pending U.S. application Ser. No. 09/052,080, incorporated herein by reference. A typical SMT-compatible gasket solution would be made up of many individual, discrete parts, depending upon the size of the shield required.

In developing an EMI gasket part that is compatible with the SMT process, two problems have been encountered; these problems are caused by the instability of the EMI gasket part during pick-and-place installation processes.

The first major problem in the installation process is created by the 1:1 aspect ratio of the part. The problem with the EMI gasket part occurs during the "pick-and-place" operation, which is related to the packaging method of the SMT parts. SMT parts are typically provided in either tape-and-reel format, or as loose pieces in bulk to be vibratory bowl-fed, for example. The tape-and-reel packaging contains formed pockets that are custom made to fit the dimensions of the SMT parts. But because of tolerances, the pockets must be made slightly larger than the SMT parts to ensure that parts do not stick in the pockets during subsequent removal with low suction-force vacuum nozzles on the SMT equipment. Since the EMI gasket parts mentioned above are more or less square in cross-section (due to this 1:1 aspect ratio), they therefore have a tendency to roll over if the pocket is too loose. This rollover can occur during original packaging of the parts into the pocket, shipping due to vibration or rough handling, cover tape removal, or during the subsequent vacuum nozzle pickup process. Since a single part placed in a rotated configuration can render a PCB non-functional, rollover is a serious problem.

Also just as serious, some SMT automation vision systems have had difficulty distinguishing a part that is correctly oriented once it has been picked from the carrier tape pocket. This second problem means that the vision safety-check, which discards misoriented parts before they are placed incorrectly, may fail. This reduces the overall reliability of the SMT solution dramatically.

It would be advantageous to provide an improved EMI gasket part directed to overcoming one or more of the limitations set forth above. Accordingly, a suitable alternative is provided, including features more fully disclosed hereinafter.

SUMMARY OF THE INVENTION

The present invention provides an electromagnetic interference gasket assembly formed of an electrically conductive material having a non-rectangular profile, whereby the profile may be viewed and processed by automated vision equipment during high-speed assembly of the gasket onto a conductive surface. Preferably, the gasket assembly has an aspect ratio of substantially 1:1. The profile is preferably a parallelogram or a trapezoid.

In another aspect, the present invention provides a method of installing an EMI gasket assembly on a conductive surface, the EMI gasket assembly being an electrically conductive material having a non-rectangular profile. The method includes the steps of feeding a selected EMI gasket assembly to a surface mount technology (SMT) machine; picking up the selected EMI gasket assembly; scanning the selected EMI gasket assembly and using the non-rectangular profile to determine proper orientation of the selected EMI gasket assembly; disposing the selected EMI gasket assembly onto a conductive surface; and attaching the selected EMI gasket assembly to the conductive surface.

In another aspect, the present invention provides a circuit board assembly having a conductive surface, an electromagnetic interference gasket assembly bonded to the conductive surface and including an electrically conductive material having a non-rectangular profile, whereby the profile may be viewed and processed by automated vision equipment during high speed assembly of the gasket onto a conductive surface.

In another aspect, the present invention provides a shield assembly having a conductive surface, an electromagnetic interference gasket assembly bonded to the conductive surface and including an electrically conductive material having a non-rectangular profile, whereby the profile may be viewed and processed by automated vision equipment during high speed assembly of the gasket onto a conductive surface.

DETAILED DESCRIPTION OF THE INVENTION

Figure 1:
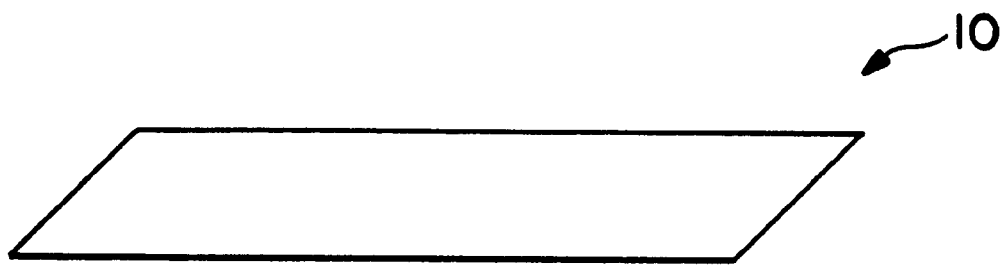
FIG. 1 is a top view of a non-rectangular gasket assembly according to an exemplary embodiment of the present invention.

Referring now to the drawings, the present invention provides an electromagnetic interference (EMI) gasket part 10, as shown in FIG. 1, which is compatible with surface mount technology (SMT) installation. Gasket part 10 has a uniquely shaped profile that decreases the probability of misorientation during the packaging, handling and installation process. By "profile" as used herein is meant the shape of the part in any view, such as a view from the top, bottom, front, back, or either side. The unique profile allows use of gasket designs having a dimensional aspect ratio of 1:1 (that is, the cross-sectional width and height of the gasket part are approximately equal), which was heretofore problematic.

As shown in FIG. 1, gasket part 10 of the present invention is manufactured to have a distinctly non-rectangular profile (as viewed from the top in FIG. 1). The preferred profile is a 45 degree parallelogram as shown in FIG. 1. The 45 degree parallelogram allows the gasket parts to be placed adjacent to one another with a very small gap between them during the manufacturing process and allows for easy manufacture, as well. Of course, any angle for the sides other than 45 degrees may be used; the only requirement is that a non-rectangular profile is produced.

Figure 2:
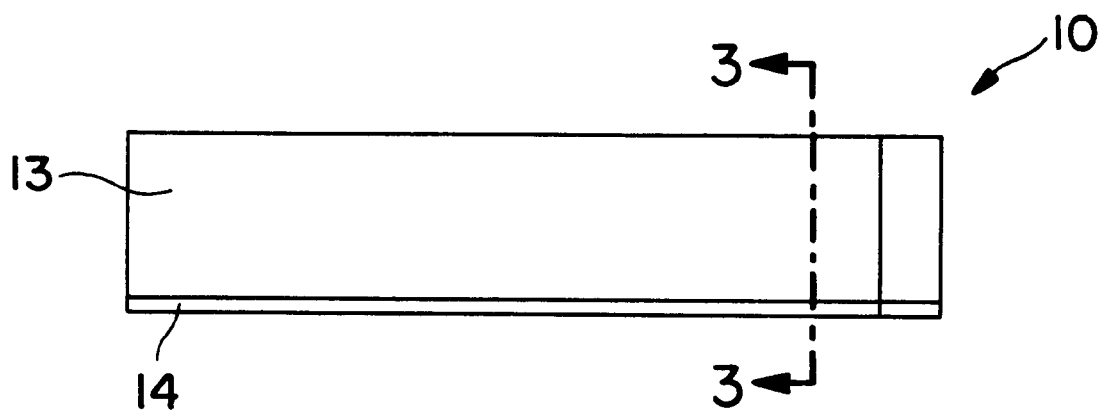
FIG. 2 is a side view of the gasket assembly of FIG. 1.

The non-rectangular profile of the gasket part serves a dual purpose. First, it drastically reduces the probability that the gasket part will roll over in the tape-and-reel pockets. Secondly, the non-rectangular shape aids the automated vision systems to recognize when gasket parts are improperly oriented, because the profile changes as the part rotates. For example, an automated vision system set up to view the tops of gasket part 10 may be programmed to pass gasket part 10 as shown in top view in FIG. 1. If the same gasket part 10 rotates 90 degrees, however, as shown in FIG. 2, which is a side view of gasket part 10 from FIG. 1, a distinctly different profile is presented; i.e., a rectangular profile. The automated vision system may be programmed to reject any parts oriented in such a way. In this way, only properly oriented parts are fed to the SMT equipment for installation. Parallelogram-shaped profiles are also desirable because a 180 degree rotation of the part can be detected (gasket part 10 will have a different profile when viewed from its top and bottom surfaces).

The automated vision systems used with this invention may be any conventional system known in the art. Non-rectangular profiles other than a parallelogram may also be used according to this invention; for example, a trapezoid. The pockets in the tape-and-reel device which contain gasket parts 10 may be any shape, but are preferably shaped to match the profile of gasket part 10.

Figure 3:
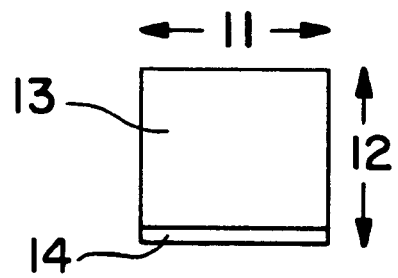
FIG. 3 is a cross-sectional view of the gasket assembly of FIG. 2.

With the present invention, it is possible to manufacture and use gasket parts 10 having a 1:1 aspect (width/thickness) ratio. As shown in FIG. 3, which is a cross-sectional view of gasket part 10 from FIG. 2, width 11 is approximately equal to thickness 12 in this preferred embodiment of gasket part 10. Thus, using the present invention, desirable 1:1 aspect ratio parts may be used with improved efficiency and reliability.

The EMI gasket parts of this invention can be installed with a standard surface mount technology (SMT) machine, thereby eliminating the need for specialized EMI gasket installation equipment.

Referring to FIGS. 2 and 3, EMI gasket part 10 is an assembly (a "gasket assembly"), which preferably comprises an electrically conductive gasket material 13, an electrically conductive solderable support layer 14, and an adhesive (not shown) to affix the electrically conductive gasket material to the support layer. During SMT installation, a solder layer preferably secures the entire assembly to a conductive surface, such as a ground trace of a PCB or to a shield for a PCB. It should be noted that the gasket material may be solderable or substantive enough to eliminate the need for the support layer. Also, conductive adhesive (as well as solder) may be used to install the gasket assembly to the PCB or shield.

One type of electrically conductive gasket material which may be particularly suited for use with the present invention is GORE-SHIELD® brand EMI gasket material type GS500, GS3000 or GS5200, available from W. L. Gore & Associates, Inc. of Newark, Del. Other suitable electrically conductive gasket materials will be described below.

It should be noted that the electrically conductive gasket part may be rectangular in cross-section. But the electrically conductive gasket shape may also be deliberately formed in a non-rectangular crosssectional shape (when viewed from the side), to achieve a desired result, such as to decrease the required force to compress the EMI gasket material with a shield. This allows for smaller screws or even snaps to fasten the shield to the PCB.

It should be also noted that the support layer 14 of the gasket assembly is only present to provide sufficient structural integrity to the gasket assembly for handling, packaging, and installation, and to also provide a solderable interface. If gasket material 13 can be handled without support layer 14, or if the gasket material itself is solderable, or if conductive adhesive is used to install the SMT part to the PCB or shield, then the support layer may not be required.

If support layer 14 is required, however, any suitable means for affixing support layer 14 to electrically conductive gasket material 13 may be used, including but not limited to non-electrically conductive adhesive, electrically conductive adhesive, molding, or mechanical means such as a barb assembly or retention clips.

In instances where an adhesive is employed to attach or affix electrically conductive gasket material 13 to support layer 14, any suitable adhesive may be used, as long as an electrical path is maintained there between. In one embodiment, a particle filled electrically conductive pressure-sensitive acrylic adhesive may be used. This adhesive is laminated to the gasket in transfer-roll form, but it may be directly applied to the gasket, or applied in some other form. In fact, the adhesive itself is not necessary for affixing the gasket to the support layer. The invention only requires some means to electrically and mechanically connect the gasket to the support layer. An electrically conductive, pressure-sensitive adhesive is one exemplary way of achieving this attachment; however, the adhesive could also be thermoset, thermoplastic, etc. Also, the adhesive might not need to be electrically conductive if the support layer can be made to mechanically touch the gasket in some areas to keep an electrical path along a z-axis (vertically, in cross-section). Additionally, the electrically conductive gasket material could be directly molded or fused to the support material or mechanically fastened in some other manner (such as with support barbs, etc.), thus eliminating the need for an adhesive altogether. Whatever the case, the fastening means must be able to withstand solder reflow temperatures (or installation adhesive curing temperatures, if required) and retain its mechanical and electrical properties.

The support layer should impart sufficient stiffness to the electrically conductive gasket material to permit the assembly to be effectively processed with SMT machines. Thus, the support layer may be made of a variety of different materials, such as plastic or metal; however if it is plastic, it must be conductive or plated with a conductive metal such as copper, nickel, gold, silver, tin, etc. If the support layer is metal, it should be made from, and/or plated with a similar metal such as described above, or an alloy thereof. Gold, silver, nickel, copper, and tin are preferred plating materials, and are used extensively in the industry. Also, the support layer may be any thickness, especially if the gasket assembly is desired to fill an existing gap in a design. Thus, the gasket thickness can be kept to a standard thickness, while modifying the support layer thickness to accommodate different designs.

Whatever material the support layer is fabricated from, it must be able to withstand solder reflow temperatures, or the installation adhesive's curing temperature. A tin-plated copper shim material, is a preferred embodiment of such a support layer.

Figure 4:
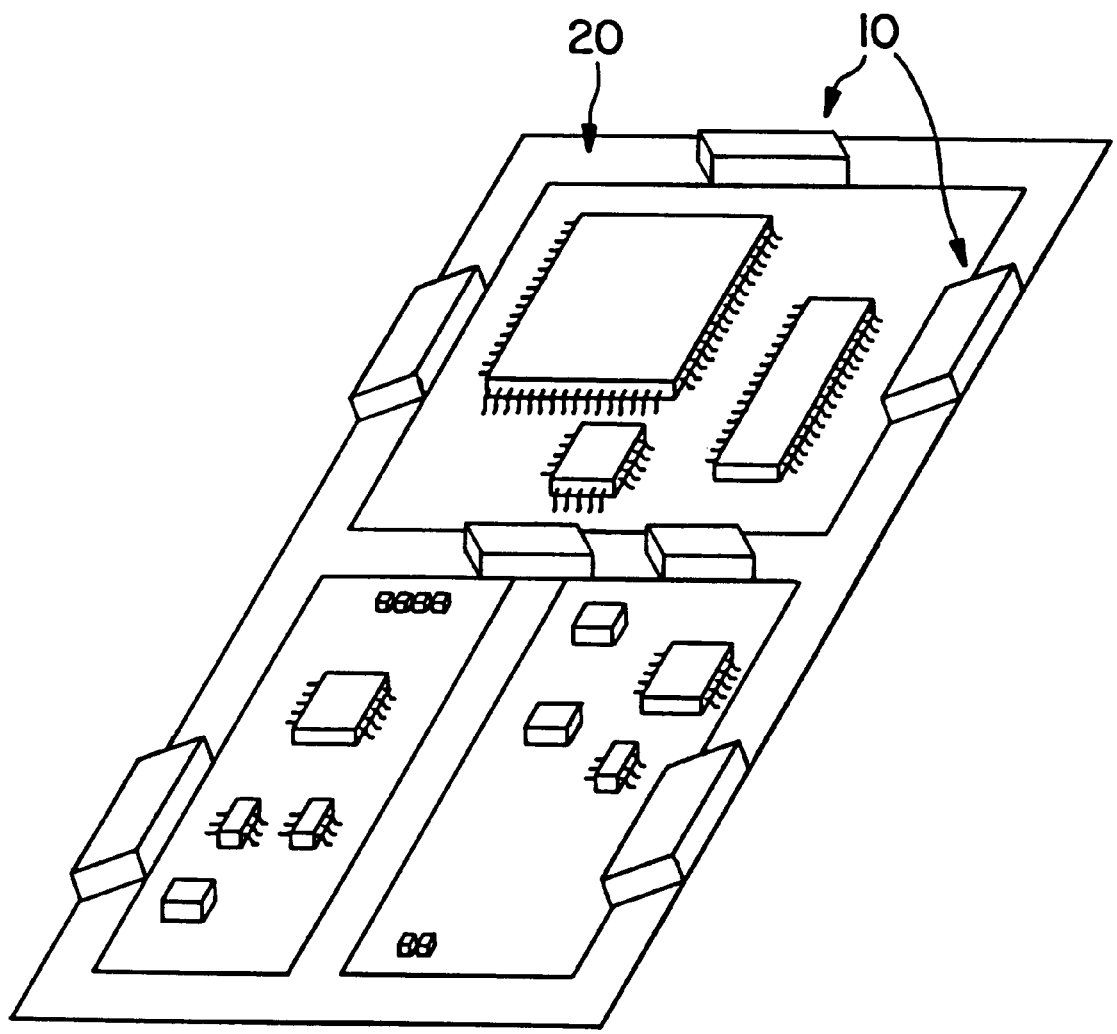
FIG. 4 is a perspective view of a printed circuit board assembly including a gasket assembly according to an exemplary embodiment of this invention.

Typically, tape-and-reel packaging is used to feed the EMI gasket assembly into an SMT machine. The assemblies are received in pockets, which are positioned to allow a vacuum head of an SMT machine to easily and precisely access and pick up the assemblies from their respective pockets in the packaging, for placement. The ground trace or conductive shield surface may be prepared with a screened pattern of solder paste (or conductive adhesive), to mate with the support layer of the assembly. Once the gasket assembly is deposited on the ground trace (with the support layer side in engagement with the solder paste or adhesive), the solder is reflowed (or the adhesive is cured), by any suitable means such as a reflow oven, for example. FIG. 4 shows a circuit board assembly 20 including gasket assemblies 10.

Alternatively, the gasket assemblies may be installed to a shield housing (rather than a PCB ground trace), using either solder or conductive adhesive.

As stated hereinabove, any suitable electrically conductive material may be used in the construction of an SMT compatible EMI gasket assembly in accordance with the teachings of the present invention. The embodiments of suitable conductive gasket material provided hereinbelow are provided for purposes of illustration only, and are not intended to limit the scope of the present invention.

ELECTRICALLY CONDUCTIVE GASKET MATERIALS

Suitable electrically conductive gasket materials may be fabricated according to the following embodiments (in all cases, the gaskets may be cut to the inventive profiles using techniques well-known in the art):

(1) an electrically conductive polymer matrix of the type described in detail in U.S. Pat. No. 5,431,571, and which is incorporated herein by reference;

(2) an electrically conductive gasket material of the type described in detail in U.S. Pat. No. 5,286,568, and which is incorporated herein by reference;

(3) a material of the type described in detail in U.S. Pat. No. 5,604,026, and which is incorporated herein by reference.

(4) an electrically conductive polytetrafluoroethylene (PTFE) article which has an expandable particulate blended into a PTFE and conductive metal composition (expandable hollow polymeric particulate is particularly useful in this embodiment and may include those materials comprised of a polymeric shell and a core of at least one other material, either liquid or gaseous, most preferably a liquid at room temperature, in which the polymeric shell is essentially insoluble);

(5) an electrically conductive polytetrafluoroethylene (PTFE) article, which has an elastomer material, and electrically conductive particles intermixed therein (specifically, the conductive gasket material of this embodiment is defined by a plurality of electrically conductive particles and PTFE in the form of paste, dispersion or powder);

(6) a dual elastomer product, as described in the following patents: U.S. Pat. Nos. 4,968,854; 5,068,493; 5,107,070; and 5,141,770;

(7) a metalized fabric-over-foam or mesh-over-foam type EMI gasket material as described in several patents, such as U.S. Pat. Nos. 4,857,668, 5,028,739, 5,045,635, 5,105,056, 5,294,270, and 5,889,229;

(8) a hollow extruded particle-filled type EMI gasket material, as described in U.S. Pat. Nos. 4,659,869, 4,864,076, and WO 99/22556;

(9) a foam-in-place or particle-filled foam type EMI gasket material, such as described in U.S. Pat. Nos. 4,931,479 and 5,855,818;

(10) a metalized filament type EMI gasket material, as described in U.S. Pat. No. 5,522,602;

(11) a form-in-place, dispensed type EMI gasket material, as described in several patents, such as U.S. Pat. Nos. 5,882,729, EP 643,551 and 643,552 and DE 4,340,108.

While advantageous embodiments have been chosen to illustrate the invention, it will be understood by those skilled in the art that various changes and modifications can be made therein without departing from the scope of the invention as defined in the appended claims.

What is claimed is:

1. An electromagnetic interference gasket assembly comprising an electrically conductive material having a non-rectangular profile, whereby said profile may be viewed and processed by automated vision equipment during high speed assembly of said gasket onto a conductive surface.

2. The electromagnetic interference gasket assembly set forth in claim 1, wherein said gasket has an aspect ratio of substantially 1:1.

3. The electromagnetic interference gasket assembly set forth in claim 1, wherein said profile is a parallelogram.

4. The electromagnetic interference gasket assembly set forth in claim 1, wherein said profile is a trapezoid.

5. The electromagnetic interference gasket assembly set forth in claim 1, wherein said electrically conductive material comprises a gasket portion and a support layer.

6. The electromagnetic interference gasket assembly set forth in claim 5, wherein said support layer is solderable.

7. A method of installing an electromagnetic interference (EMI) gasket assembly on a conductive surface, said EMI gasket assembly being of the type comprising an electrically conductive material having a non-rectangular profile, said method comprising the steps of:

a) feeding a selected EMI gasket assembly to a surface mount technology (SMT) machine;

b) picking up the selected EMI gasket assembly;

c) scanning the selected EMI gasket assembly and using the non-rectangular profile to determine proper orientation of the selected EMI gasket assembly;

d) disposing the selected EMI gasket assembly onto a conductive surface; and e) attaching the selected EMI gasket assembly to the conductive surface.

8. The method of claim 7 further comprising the step of rejecting the selected electromagnetic interference EMI gasket assembly if the selected EMI gasket is not properly oriented according to step c).

9. The method of claim 7 wherein said step of scanning is performed by an automated vision system.

10. A circuit board assembly comprising a circuit board having a conductive surface; and an electromagnetic interference gasket assembly bonded to said conductive surface and comprising an electrically conductive material having a non-rectangular profile, whereby said profile may be viewed and processed by automated vision equipment during high speed assembly of said gasket onto a conductive surface.

11. A shield assembly comprising a shield having a conductive surface; and an electromagnetic interference gasket assembly bonded to said conductive surface and comprising an electrically conductive material having a non-rectangular profile, whereby said profile may be viewed and processed by automated vision equipment during high speed assembly of said gasket onto a conductive surface.

* * * * *